July 23, 1968 M. FISCHMAN 3,394,321

SQUARE-WAVE OSCILLATOR WITH SERIES-RESONANT CIRCUIT

Filed Jan. 3, 1967

INVENTOR.
MARTIN FISCHMAN

BY R. J. Frank
ATTORNEY.

3,394,321

SQUARE-WAVE OSCILLATOR WITH SERIES-RESONANT CIRCUIT

Martin Fischman, Wantagh, N.Y., assignor to General Telephone & Electronics Laboratories Incorporated, a corporation of Delaware Filed Jan. 3, 1967, Ser. No. 606,965
10 Claims. (Cl. 331—117)

ABSTRACT OF THE DISCLOSURE

An oscillator for generating a frequency stable square-wave signal having steep leading and trailing edges. The oscillator frequency is determined by an L-C series resonant circuit contained in the feedback circuit. To minimize the loading of the resonant circuit and increase its Q, the drive and feedback transistors are coupled electrically in series with the resonant circuit.

*Background of the invention*

The invention relates to oscillators having a square-wave output signal and, in particular, to a square-wave oscillator employing both an inductance-capacitance (LC) type resonant circuit and a transistor in the oscillator feedback circuit.

Oscillators designed to generate frequency stable square-wave output signals having steep leading and trailing edges and equal duration half cycles find wide application in television and other electronic apparatus. These known oscillators are generally of the relaxation type in which the frequency is determined by resistance-capacitance (RC) or resistance-inductance (RL) networks. However, it has been found that relatively wide frequency variations occur in relaxation oscillators with changes in supply voltage, transistor characteristics, or the loading of the frequency-determining networks and that these variations render them unsatisfactory for many applications requiring high frequency stability.

A second type of square-wave oscillator utilizes an L-C type resonant circuit to obtain improved frequency stability. Typical examples of this type of oscillator are known in the art as the Hartley, Colpitts, and Clapp configurations. In these known configurations, the base-emitter junction of the transistor employed therein is connected in shunt or parallel with the resonant circuit. The shunt connection results in a loading of the resonant circuit due to the low impedance of the base-emitter junction and a corresponding decrease in the Q of the resonant circuit. (The Q of a resonant circuit is a measure of the efficiency of the circuit and is generally expressed as a function of the ratio of the energy dissipated per unit time to the energy stored in the circuit per unit time. In addition, the Q of the resonant circuit determines the magnitude of the resonant circuit current and voltage.) Since the resonant circuit of these oscillators provides the feedback signal to the base of the transistor, the magnitude and time rate of change of the feedback signal determines the time required to render the switch fully conductive. The time required to drive the transistor from its nonconductive to fully conductive state determines the shape of the leading and trailing edges of the square-wave output signal. To generate square-wave output signals having steep waveform edges, the loading of the resonant circuit should be minimized and the Q of the circuit maximized.

*Summary of the invention*

The present invention relates to a square-wave oscillator containing a series resonant circuit as the frequency determining element. In addition, the oscillator includes first and second semiconductor switching elements, referred to herein as the driving transistor and the feedback transistor, respectively. The transistors are each provided with first, second, and third electrodes with the second electrode being the control electrode. The transistors are utilized in the present oscillator as low impedance switches and are driven from their nonconductive to fully conductive states by the application of a current of selected polarity to their second electrodes.

The series resonant circuit is characterized by a resonant frequency of oscillation at which the reactance of the circuit is essentially zero. Consequently, the resonant circuit current is maximized at this frequency. The resonant circuit contains first and second terminals and, at the resonant frequency, the currents at these terminals are in phase. The first terminal is coupled to the third electrode of the driving transistor. The second terminal of the resonant circuit is coupled to the second electrode of the feedback transistor. The first electrodes of both transistors are coupled to a reference potential, i.e., ground.

Further, the third electrode of the drive transistor is coupled to a supply voltage source through a first impedance. When the drive transistor is rendered conductive, the first terminal of the resonant circuit is coupled to ground through the low impedance of this first transistor. During the following interval the drive transistor is in its nonconductive state and the voltage at the third electrode of this transistor increases thereby supplying energy to the resonant circuit. To maintain a low impedance conducting path to ground at the first terminal during this interval, one electrode of a first diode is coupled to the third electrode of the drive transistor. The other electrode of the first diode is coupled to biasing means which both establishes the voltage level at the first terminal of the resonant circuit during the interval that the drive transistor is nonconductive and provides a low AC impedance conducting path to ground. Typically, the biasing means is a capacitor which is charged to a voltage level which exceeds the magnitude of the supply voltage source. The signal appearing at the third electrode of the drive transistor is a square-wave voltage which varies between ground and the voltage level established by the biasing means. The repetition rate of the square-wave signal is determined by the resonant frequency of the resonant circuit due to a feedback circuit from the second terminal of the resonant circuit to the control electrode of the driving transistor.

The feedback circuit comprises a feedback transistor and a second diode. The control electrode of the feedback transistor is coupled to the second terminal of the resonant circuit. In addition, the first electrode of the second diode is coupled to the second terminal of the resonant circuit. Both the first electrode of the feedback transistor and the second electrode of the diode are coupled to ground. The resonant circuit current drives the feedback transistor into conduction during one-half cycle whereupon the second terminal of the circuit is coupled to ground through the transistor. During the following half-cycle, the feedback transistor is nonconductive and the second terminal of the resonant circuit is coupled to ground through the second diode. Thus, a low impedance path to ground is continuously provided at both terminals of the resonant circuit.

The third electrode of the feedback transistor is coupled to the control electrode of the drive transistor. Also, the third electrode of the feedback transistor is coupled through second impedance means to the supply voltage source. During the interval that the resonant circuit current renders the feedback transistor conductive, the third electrode of this transistor is coupled to ground. Consequently, no signal is fed back to the control electrode of the driving transistor and it is nonconductive. When the feedback transistor is nonconductive, the voltage level at its third electrode increases toward the magnitude of the supply voltage source and renders the drive transistor conductive. It is to be noted that both transistors are utilized as low impedance switches and, when conductive, are coupled in electrical series with the resonant circuit.

When the oscillator is in operation, a square-wave output signal appears at the third electrodes of both the drive and feedback transistors. These signals differ in phase by 180 degrees and are both characterized by having steep leading and trailing edges. The present oscillator possesses the frequency stability of an L-C resonant circuit. The Q of the resonant circuit is large, within the approximate range of 20 to 100, due to the low impedance series conducting paths provided. Consequently, the magnitude of the resonant circuit current is large and its waveform is characterized by a rapid time rate of change. In addition, the sinusoidal voltage provided in the resonant circuit is many times the supply voltage. The high Q of the resonant circuit insures that the transistors are driven rapidly between their nonconductive and fully conductive states and that the square-waves have steep leading and trailing edges.

Further features and advantages of the invention will become more readily apparent from the following detailed description of a specific embodiment thereof when taken in conjunction with the accompanying drawings.

*Description of the preferred embodiments*

Figure 1:
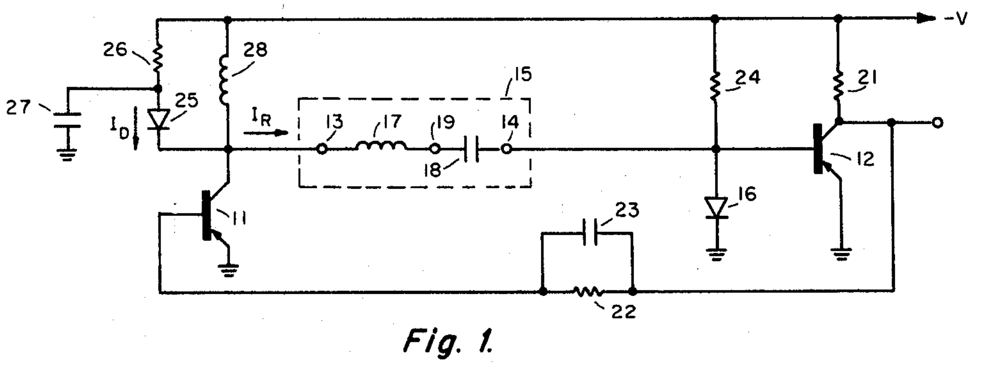
FIG. 1 is an electrical schematic diagram of one embodiment of the invention.

As shown in FIG. 1, the square-wave oscillator comprises drive transistor 11 and feedback transistor 12, each of which have base, emitter and collector electrodes. Transistors 11 and 12 are shown as PNP conductivity type transistors, however, NPN type transistors may be employed if desired. The emitters of both transistors 11 and 12 are connected to a reference potential or ground. The collector of transistor 11 is coupled to first terminal 13 of series resonant circuit 15. Second terminal 14 of circuit 15 is coupled to the base of transistor 12. In addition, terminal 14 is coupled to the first electrode of diode 16. The second electrode of diode 16 is coupled to ground.

The series resonant circuit 15 includes inductor 17 and capacitor 18 connected in electrical series. The resonant circuit has a characteristic frequency of oscillation which is a function of the magnitude of the reactances of inductor 17 and capacitor 18 and is approximately expressed as $$\frac{1}{2\pi(LC)^{1/2}}$$

Figure 2:
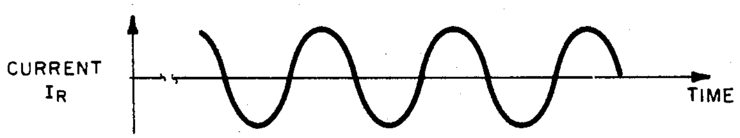
FIGS. 2 through 7 show representative voltage and current waveforms occurring at different points in the embodiment of FIG. 1.
Figure 3:
Figure 4:
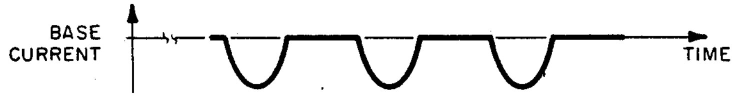
Figure 6:
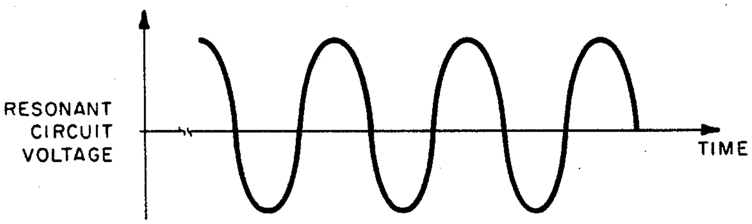

When the circuit is in a resonant state, the waveform of the voltage appearing at terminal 19, shown in FIG. 6, is sinusoidal and varies at the characteristic frequency. Similarly, the resonant circuit current $I_R$, shown in FIG. 2, is sinusoidal and varies in phase with and at the same frequency as the voltage at terminal 19.

The collector of feedback transistor 12 is coupled through resistor 21 to a negative voltage source —V. In addition, the collector is coupled through the parallel combination of resistor 22 and capacitor 23 to the base of drive transistor 11. The base of transistor 12 is coupled through large base resistor 24 to voltage source —V. This connection is utilized only during the period required to initiate oscillation and is not required during normal operation of the oscillator.

The collector of drive transistor 11 is coupled to the second electrode of first diode 25. The first electrode of this diode is coupled through resistor 26 to voltage source —V. In addition, the first electrode of diode 25 is coupled to ground through capacitor 27. The collector of drive transistor 11 is also coupled to voltage source —V through shunt-feed coil 28.

The operation of the circuit may be best described by assuming that the oscillator has been operating for a sufficient number of cycles so that initial starting transients have been eliminated. Under these conditions, circuit 15 is in a resonant state with energy being alternately transferred from inductor 17 to capacitor 18. The voltage at terminal 19 is shown in FIG. 6. The resonant circuit current $I_R$ is in phase with the voltage and shown in FIG. 2. When the current $I_R$ flows in the direction of the arrow in FIG. 1, the diode 16 provides a low impedance conducting path to ground. The base of feedback transistor 12 is maintained essentially at ground during this half-cycle of the resonant cycle and is in its nonconductive state.

Accordingly, the voltage level appearing at the collector of feedback transistor 12 is negative and approaches the magnitude of the supply voltage —V. The voltage level during the interval in which transistor 12 is nonconductive is determined by the relative magnitudes of resistors 21 and 22. A decrease in the magnitude of resistor 22 results in a corresponding decrease in the voltage swing at the collector of transistor 12. When the current $I_R$ reverses direction in the following half-cycle, the transistor 12 is driven into conduction and the collector electrode is essentially at ground. During this interval, the low impedance base-emitter junction of transistor 12 is in electrical series with the resonant circuit 15. It shall be noted that diode 16 is nonconductive during this interval.

Figure 7:
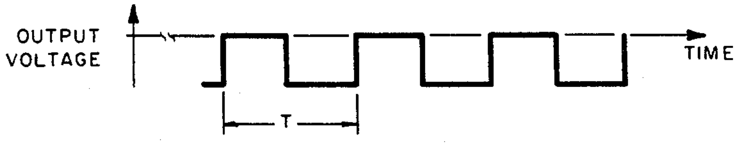

The output of the oscillator, shown in FIG. 7, is normally taken at the collector of transistor 12 to minimize any effect that the external load might have on the frequency stability of the L-C resonant circuit. However, in embodiments wherein the collector of feedback transistor 12 is coupled directly to the base of drive transistor 11 the output voltage is taken at the collector of drive transistor 11. The capacitor 23, in parallel with resistor 22, is provided in the embodiment of FIG. 1 to insure a rapid response by transistor 11 to the edges of the square-wave signal appearing at the collector of transistor 12.

When the resonant circuit current $I_R$ flows in the direction shown in FIG. 1, the diode 16 couples terminal 14 to ground and transistor 12 is nonconductive. The voltage at the collector of transistor 12 is negative with respect to ground and transistor 11 is in its conductive state. Thus, the collector of transistor 11 is at ground and transistor 11 may be considered to be in electrical series with terminal 13 of resonant circuit 15. At the start of the following half-cycle, the current $I_R$ reverses direction and renders transistor 12 conductive whereby the collector of transistor 12 and the base of transistor 11 are at ground. Consequently, transistor 11 is nonconductive and current flow therethrough is terminated.

When transistor 11 is conducting, current is flowing from ground through the transistor and coil 28. The turning-off of transistor 11 removes the transistor as the source of current through coil 28. However, the current flowing through the coil does not change instantaneously. In addition, any change in the current tends to drive the voltage at the collector of transistor 11 sharply negative. As shown in FIG. 1, the circuit is provided with means for supplying the coil current during the interval that transistor 11 is nonconductive.

To supply this current, the collector of transistor 11 is coupled to diode 25. The diode 25 is poled so that the magnitude of the voltage of the collector of the transistor cannot substantially exceed that at the first electrode of diode 25. When the voltage at the collector reaches this negative level, the diode 25 becomes conductive and supplies a current $I_D$ to the coil 28. The direction of $I_D$ is shown by the arrow in FIG. 1.

The first electrode of diode 25 is coupled, in effect, to a voltage source which provides a voltage of −2V or twice the supply voltage −V at the diode. Assuming an embodiment wherein a battery replaces resistor 26 and capacitor 27, this battery is required to provide the coil current during the interval that transistor 11 is nonconductive. In operation, the waveform of the voltage at the collector of transistor 11 (shown in FIG. 7) is a square-wave which varies between ground and a negative voltage. Since the on and off times of transistor 11 are equal due to the frequency stability of L-C resonant circuit 15 and the collector of transistor 11 is coupled through an essentially zero D-C impedance shunt feed coil 28, the average value of the collector voltage is −V. Thus, the negative voltage level that the battery is required to provide at the collector is −2V during the interval that transistor 11 is nonconductive.

At the time that transistor 11 is turned-off, the voltage at the collector of the transistor tends to be driven sharply negative since the current through coil 28 attempts to continue flowing. However, the voltage at the first electrode of diode 25 limits the negative excursion of this voltage to −2V. Thus, the coil current is supplied through diode 25 which is conductive. This current is continually supplied to the coil and keeps diode 25 in conduction until transistor 11 is again turned-on. At this time, the voltage level at the collector is essentially ground and diode 25 is nonconductive.

Figure 5:
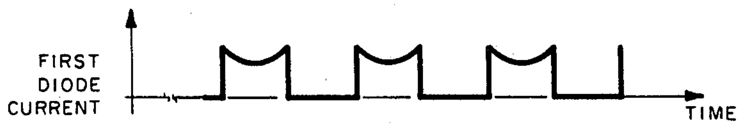

While the diode current $I_D$ supplies the coil current, its waveform is not square since the resonant circuit $I_R$ flows in the direction opposite to that shown in FIG. 1 during this interval. The peak in the current $I_R$ occurs in the middle of the interval during which diode 25 is conductive and the resultant waveform of current $I_D$ is shown in FIG. 5. Since diode 25 is maintained conductive by the flow of coil current when transistor 11 is turned-off, a low A-C impedance path is provided through the diode to ground for the resonant circuit current.

As mentioned, a voltage source of −2V is coupled to the first electrode of diode 25. However, this source need not be a battery and may comprise a capacitor 27 as shown in FIG. 1. In the embodiment shown, the capacitor 27 is coupled between the diode and ground with the diode being coupled through resistor 26 to voltage source −V. As a result, current is continually being supplied to the capacitor from the source. When the transistor 11 is turned-off, the capacitor is required to supply current to the coil until the transistor is again rendered conductive.

In operation, it is found that capacitor 27 is charged to a voltage of −2V. Assuming that the capacitor 27 is not coupled via resistor 26 to a voltage source −V, the combination of diode 25 and capacitor 27 would function as a peak detector with the capacitor voltage becoming increasingly negative. However, supplying current through resistor 26 offsets the effect of diode current $I_D$ and results in the voltage across capacitor 27 being stabilized. Neglecting the initial starting transients, the charge flowing through resistor 26 during a complete period is essentially equal to the charge supplied by the capacitor 27 during the one-half period in which diode current $I_D$ flows.

While the output is preferably obtained from the collector of feedback transistor 12 to minimize any effect of the external circuit on resonant circuit 15, the drive voltage for the resonant circuit which appears at the collector may be utilized as the output signal in certain applications. One such application is when resistor 22 and capacitor 23 are omitted from the feedback path.

The aforedescribed oscillator provides square-wave output signals having L-C resonant circuit frequency stability and equal duration half-cycles. The drive and feedback transistors function as low impedance switches controlled in the L-C circuit. The provision of low series impedance conducting paths at terminals 13 and 14 of the resonant circuit minimizes the dissipation therein and correspondingly increases the Q of the resonant circuit. Accordingly, the resonant circuit current is relatively large and is characterized by a large time rate of change. Thus, the feedback transistor is rapidly switched between its conductive and nonconductive states so that the square-wave output signal has steep leading and trailing edges.

In one embodiment tested and operated, the component values were as follows:

| | |
|---|---|
| Transistors **11** and **12** | Type 2N782. |
| Diodes **16** and **25** | Type IN279. |
| Inductor **17** | 1 mh. |
| Capacitor **18** | 270 pf. |
| Resistors **21** and **26** | 100 Ω. |
| Resistor **22** | 560 Ω. |
| Capacitor **23** | 100 pf. |
| Capacitor **27** | 0.1 μf. |
| Resistor **24** | 22 KΩ. |
| Supply voltage −V | −5 v. |

The period of the square-wave output signal was 3 μsec. and the resonant circuit current was 200 ma. peak to peak. The output signal at the collector of feedback transistor 12 varied between 0 and about −4 v. The signal at the collector of drive transistor 11 varied between 0 and about −10 v. The resonant circuit voltage was 200 v. peak to peak.

While the above description has referred to a specific embodiment of the invention, it will be apparent that many modifications and variations may be made therein without departing from the spirit and scope of the invention.

What is claimed is:

1. A square-wave oscillator comprising (a) a first semiconductor switching element having first, second and third electrodes, said first electrode being coupled to a reference potential;

(b) a series resonant circuit having a characteristic frequency of oscillation, said circuit having first and second terminals, said first terminal being coupled to the third electrode of said first switching element;

(c) a second semiconductor switching element having first, second, and third electrodes, said first electrode being coupled to the reference potential, said second electrode being coupled to the second terminal of said resonant circuit, said third electrode being coupled to the second electrode of said first switching element;

(d) a first diode having first and second electrodes, the second electrode of said first diode being coupled to the third electrode of said first switching element;

(e) a second diode having first and second electrodes, said first electrode being coupled to the second terminal of said resonant circuit, said second electrode being coupled to the reference potential;

(f) first impedance means having first and second terminals, said first terminal being coupled to the third electrode of said first switching element, said second terminal being coupled to the first electrode of said first diode;

(g) second impedance means having first and second terminals, said first terminal being coupled to the third electrode of said second switching element, said second terminal being coupled to the first electrode of said first diode; and (h) means for applying a voltage to the first electrode of said first diode, a square-wave voltage being generated at the third electrode of said first switching element, said voltage having a repetition rate determined by the frequency of oscillation of said resonant circuit.

2. A square-wave oscillator in accordance with claim 1 in which said first and second switching elements comprise first and second transistors respectively.

3. A square-wave oscillator in accordance with claim 2 in which said first and second transistors are of the same conductivity type, said transistors being rendered conductive by the application of a first polarity current to the second electrodes thereof.

4. A square-wave oscillator in accordance with claim 3 in which said first and second diodes are poled to provide low impedance conducting paths for second polarity currents flowing from said first to second electrodes.

5. A square-wave oscillator in accordance with claim 4 further comprising (a) a first resistor having first and second terminals, said first terminal being coupled to the first electrode of said first diode, and in which said first impedance means comprises (b) an inductor having first and second terminals, said first terminal being coupled to the second terminal of said resistor and said second terminal being coupled to the third electrode of said first transistor.

6. A square-wave oscillator in accordance with claim 5 in which said second impedance means comprises a second resistor coupled between the second terminal of said first resistor and the third electrode of said second transistor, said second resistor being coupled to the first electrode of said first diode through said first resistor.

7. A square-wave oscillator in accordance with claim 6 further comprising the parallel combination of a resistor and a capacitor, said combination being coupled between the second electrode of said first transistor and the third electrode of said second transistor.

8. A square-wave oscillator in accordance with claim 6 in which said means for applying a voltage to the first electrode of the first diode comprises means for coupling the second terminal of the first resistor to a supply voltage source, and, said oscillator further comprising (a) biasing means coupled to the first electrode of the first diode, said biasing means establishing a voltage level at said first electrode which exceeds the magnitude of the supply voltage source.

9. A square-wave oscillator in accordance with claim 8 in which said biasing means comprises a capacitor coupled between the first electrode of the first diode and the reference potential.

10. A square-wave oscillator in accordance with claim 9 further comprising a base resistor having first and second terminals, said first terminal being coupled to the second electrode of the second transistor and said second terminal being coupled to the second terminal of the first resistor.

References Cited

UNITED STATES PATENTS 3,218,575 11/1965 Wittman ---------- 331—116 X
3,218,577 11/1965 Fischman ---------- 331—117

ROY LAKE, *Primary Examiner.*

S. H. GRIMM, *Assistant Examiner.*